United States Patent [19]

Carlstedt

[11] Patent Number: 5,239,502
[45] Date of Patent: Aug. 24, 1993

[54] BIT STORAGE CELL

[75] Inventor: Lars G. Carlstedt, Partille, Sweden

[73] Assignee: Carlstedt Elektronik AB, Gothenburg, Sweden

[21] Appl. No.: 739,555

[22] Filed: Aug. 2, 1991

[30] Foreign Application Priority Data

Aug. 2, 1990 [SE] Sweden .................. 9002558

[51] Int. Cl.$^5$ .............................................. G11C 11/41
[52] U.S. Cl. ................................... 365/154; 365/156; 365/190
[58] Field of Search ............... 365/174, 175, 190, 154, 365/156, 189.07, 190, 203, 204

[56] References Cited

U.S. PATENT DOCUMENTS

| 3,610,967 | 10/1971 | Palfi ........................... 365/154 |
| 3,634,833 | 1/1972 | Dunn et al. ................. 365/155 |
| 3,953,866 | 4/1976 | Russell ....................... 365/156 |

FOREIGN PATENT DOCUMENTS

| 2460150 | 6/1976 | Fed. Rep. of Germany ...... 365/154 |
| 2654460 | 7/1977 | Fed. Rep. of Germany . |
| 2091964 | 1/1972 | France . |
| 58-147889 | 9/1983 | Japan . |
| 62-134890 | 6/1987 | Japan . |

Primary Examiner—Eugene R. LaRoche
Assistant Examiner—Andrew Tran
Attorney, Agent, or Firm—Young & Thompson

[57] ABSTRACT

A fast memory bit cell suitable for implementation in VLSI techniques permitting a high cell density. The cell includes a cell circuit in which a logical bit value is storable, a first connection permanently tied to a supply voltage, a second, third and fourth connection, each able to assume a different control state. Each combination of control states on the second, third and fourth connection sets the memory bit cell in an individual among a set of functional states.

20 Claims, 1 Drawing Sheet

BIT STORAGE CELL

This invention relates to a bit storage cell in a memory.

BACKGROUND OF THE INVENTION

A conventional associative memory has storage cells divided into an associative area and a storage area. The writing of information into an associative memory is made without address The storage cell area is commonly arranged as shift registers The computer was invented during the 1940's. Since then it has been developed with a revolutionary speed. In spite of this, current days computers have almost the same architecture as the first ones.

Most improvements have been made in the hardware The introduction of VLSI and the enhancement in lithography has made it possible to build one chip computers that only five years ago were called super computers. The dimensions have shrunk exponentially and are now less than 1 micrometer. The clock rate as well as the number of active transistors have increased many orders of magnitude Physical limitations will probably limit the line width to 0.2 micrometer.

OBJECTS OF THE INVENTION

The main object of the invention is to provide a bit storage cell particularly adapted to an associative memory which may act as an active part of a computer and thus not only store information but to take a part in logical operations as well.

Another object of the invention is to provide a bit storage cell which could have a very high packing density.

A further object of the invention is to provide a bit storage cell which can be implemented in VLSI-techniques (VLSI=Very Large Scale Integration).

Still another object is to provide a bit storage cell which is optimized for high speed operations

SUMMARY OF THE INVENTION

The invention contemplates a bit storage cell for an associative memory in which cell a value $v_{store}$ is storable, the value being either 'true' or 'false', the cell having a structure such that it is settable in several different functional states and including a first connection which is constantly provided with a supply voltage, a second, a third and a fourth connection each of which is settable in at least three different control states, each combination of the control states on the second, third and fourth setting the storage cell in an individual among the functional states.

The memory bit cell is adapted for implementation in VLSI techniques and includes:
- a cell circuit in which a bit value is storable, said value being either 'true' or 'false';
- a first connection which is constantly provided with a supply voltage;
- a second, a third and a fourth connection each of which is settable in different control states; said cell circuit being such that each combination of the control states on the second, third and fourth connection is setting said memory bit cell in an individual among a set of functional states.

The control states for controlling the cell circuit are "high" level, "low" level, no current into cell, current into cell for all said second, third and fourth connections and also current out of cell for at least one of the connections, "high" and "low" level being related to if the voltages are regarded as positive or negative going, i.e. related to if the voltage Vcc on said first connection is positive or negative in relation to earth.

The second connection is an access connection and said third and fourth connections (d, d*) having signals having inverted levels to each other when writing or reading the cell circuit It is controlled by a control cycle including two phases, a first precharge phase in which said second, third, and fourth connection is connected to an extra voltage lying between said first connection voltage and earth, and a second operation phase for setting it in a prescribed functional state, a "high" and "low" level being taken in relation to said extra voltage, said "high" and "low" level being related to if the voltages in the circuit are regarded as positive or negative going The memory bit cell according to the invention is able to perform many functions even though it only includes four connections of which three are controllable It includes very few components. This gives a possibility to make a compact storage device including a huge amount of memory bit cells.

An associative memory particularly suited to cooperate with a reduction type of computer, and for which the bit storage cell according to the invention is particularly suited, is described in the copending U.S. application Ser. No. 07/739,541.

BRIEF DESCRIPTION OF THE DRAWINGS

For a more complete understanding of the present invention and for further objects and advantages thereof, reference is now made to the following description taken in conjunction with the accompanying drawings, in which.

DESCRIPTION OF THE PREFERRED EMBODIMENTS

The bit storage cell according to the invention, below called bit cell, is intended to be a bit cell in a storage field in a storage cell including a great number of bit cells controlled by external composed digital information distributed to all the bit cells through an information bus connected to drive and sense circuits. An information on external connections is written into the cells. An information in the cells is read from the cells to external connections.

Each bit cell in each storage field can be controlled from a head of the storage field such that the bit cells can perform one of the following operations at a time:
- rest in which each bit cell keeps a stored bit value stored,
- read in which a stored bit value in the bit cell is read,
- write in which a bit value is written into the bit cell,
- compare in which a data word composed by bit values stored in bit cells according to the invention is compared with another data word.

The control is dependent on logical conditions. These are not a part of the actual invention and are therefore not described in this application.

Figure 1:
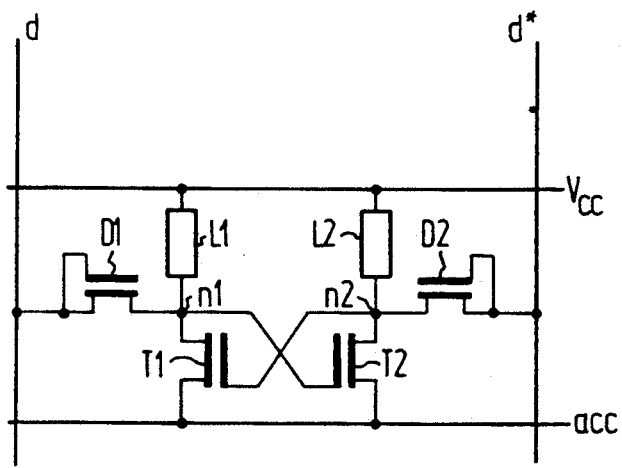
FIG. 1 illustrates schematically a first embodiment of a bit storage cell in a storage cell.

The embodiment of a bit cell according to the invention shown in FIG. 1 is connected to the external control with two wires d and d*. A wire acc connected to the head (not shown) interconnects all the bit cells within a storage cell which includes several, for instance 38, bit cells. All the bit cells in a storage cell are controlled by signals on the wire acc. The other wires d and d* connected to the bit cell are connected to corresponding bit cells in other storage cells in a memory which includes a great amount of storage cells.

The whole memory is intended to be implemented in VLSI-techniques (VLSI=Very Large Scale Integration). Each bit cell has thus a design adapted to be implemented in VLSI-techniques and it is optimized for high packing density of a large amount of bit cells. As seen in FIG 1 the bit cell has only four connections (wires), i.e. a first connection $V_{cc}$ which is constantly provided with a supply voltage, and a second, a third and a fourth connection acc, d, d* each of which is settable in at least three different control states, as will be described in further detail below.

The embodiment of the bit cell shown in FIG. 1 is a four transistor CMOS cell. The transistors are n-type transistors in the shown embodiment. However, the components in the bit cell circuit can be of many different kinds, which will be apparent from a list of components given below. The four transistor CMOS cell is static and has a resistive load. The cell is a flip-flop controllable from each side. Between the access wire acc and the supply wire $V_{cc}$ two series connections, each including the source/drain path of a MOS FET and a load T1,L1 and T2,L2, respectively, are provided in parallel. The drain of the transistor T1 is connected to the gate of the transistor T2, and the drain of the transistor T2 is connected to the gate of the transistor T1. A diode D1 is connected between the wire d and the interconnection n1 between the drain of the transistor TI, the load L1 and the gate of the transistor T2. A diode D2 is connected between the wire d* and the interconnection n2 between the drain of the transistor T2, the load L2 and the gate of the transistor T1. Each of the diodes D1 and D2 are provided by a MOS FET having the drain and gate connected to each other and connected to the wire d and d*, respectively The essential qualities of the circuit elements are that the diodes D1 and D2 are elements permitting current to flow only in one direction relative to the wires d and d*, and that the transistors are active elements in which the current can be controlled by variation of the potential of their gates. The interconnections n1 and n2 are nodes on which a potential related to a one bit information is storable. Each load is an element which behaves like a resistor In the embodiment in FIG. 1 the voltage $V_{cc}$ is shown to be a high potential. The diodes D1 and D2 are then directed such that current is flowing from the wire d or d to the node n1 or n2, respectively. The resistance of an active element T1 or T2, respectively, is lowered when the potential on its gate electrode is increasing. Thus, the node at its drain is then lowered. However, in other embodiments potentials and currents could be chosen to have the opposite directions to the ones shown in the embodiment according to the FIG. 1.

The components in the circuit in FIG. 1 could be chosen in a lot of different ways. The diodes D1 and D2 could be chosen among the following components:
(1) n-channel MOS FET in which the drain and the gate are interconnected (positive voltages).
(2) p-channel MOS FET in which the drain and the gate are interconnected (negative voltages).
(3) pn-diode (positive voltages, negative voltages with the diode reversed).
(4) Schottky-diode (positive voltages, negative voltages with the diode reversed.

As the active elements T1 and T2 the following components could be used:
(1) n-channel MOS FET (positive voltages).
(2) p-channel MOS FET (negative voltages).
(3) npn transistor (positive voltages).
(4) pnp transistor (negative voltages)

As the loads L1 and L2 the following components could be used:
(1) a resistor
(2) n-channel enhancement type MOS FET having its drain and gate interconnected (positive voltages).
(3) p-channel enhancement type MOS FET having its drain and gate interconnected (negative voltages).
(4) n-channel depletion type MOS FET having its drain and gate interconnected (positive voltages).
(5) p-channel depletion type MOS FET having its drain and gate interconnected (negative voltages).
(6) n-channel MOS FET having its gate as a control electrode and the source and the drain as drive connections (positive voltages).
(7) p-channel MOS FET having its gate as a control electrode and the source and the drain as drive connections n(negative voltages).
(8) npn transistor having the base as the control electrode and the emitter and collector as drive connections (positive voltages).
(9) pnp transistor having the base as the control electrode and the emitter and collector as drive connections (negative voltages)

With positive and negative voltages is meant that Vcc is positive or negative, respectively, in relation to earth The "low" and "high" voltage used below thus being related to if the voltages in said bit cell are regarded as positive or negative going, i.e related to if the voltage Vcc on said first connection is positive or negative in relation to earth.

Figure 2:
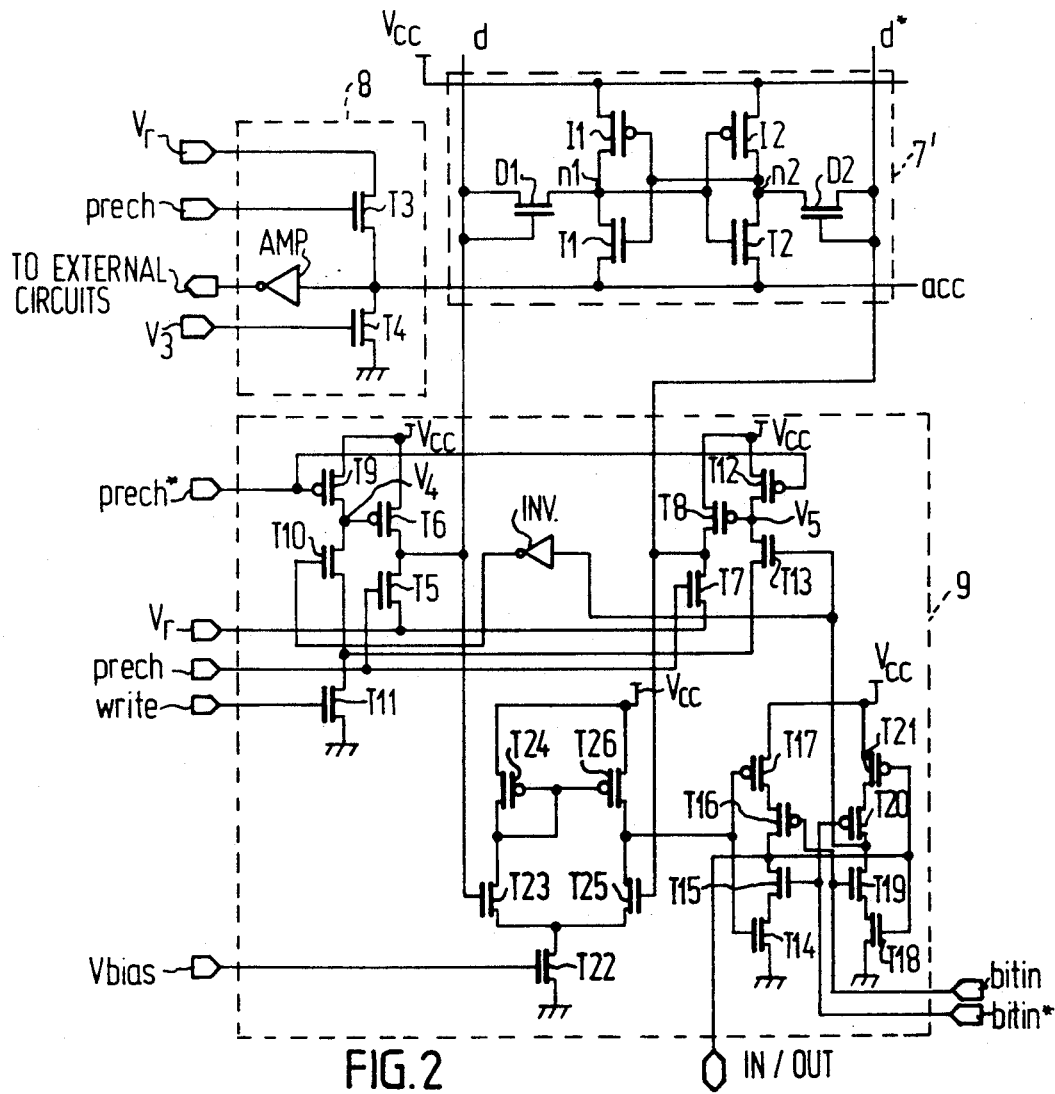
FIG. 2 illustrates schematically a second embodiment of a bit storage cell in a storage cell and drive and sense circuits connected to it.

A second embodiment of the bit cell circuit, together with drivers for the bit cell wires d, d* and acc, is shown in FIG. 2. Elements corresponding to elements in FIG. 1 have the same references The bit cell 7' is shown surrounded by dashed lines The load is the source/drain path of a MOS FET I1 and I2, respectively, shown to be of p-type in this embodiment, i.e. the opposite type of the type of the transistors T1 and T2 shown to be of n-type in this embodiment The gate of the transistor I1 is connected to the node n2, and the gate of the transistor I2 is connected to the node n1.

Regarding the bit cell embodiments both in FIG. 1 and in FIG. 2, the bit cell can store a value $v_{store}$, the value being either ,true, or 'false'. The bit cell has a structure such that it is settable in several different functional states by setting different potentials on the wires acc, d and d*.

The control states are high level, low level, current into cell for all the wires and also current out of cell for the wire acc. The wire acc is an access wire going from a head 8 and connected to all the bit cells 7' in a storage cell. The third and fourth wires d and d* have signals inverted to each other when writing or reading of the cells is made and the access wire acc is LOW.

The drive and sense amplifiers in the head 8 are illustrated schematically in a dashed square in FIG. 2. The control of the access wire acc is made in the head 8, which in turn is controlled from an external control, which may be a computer, and which provides the voltages Vr and V3, and also a precharge signal prech. A first transistor T3, in this embodiment shown as being of n-type, has its source connected to a voltage Vr, its drain to the access wire acc in all the bit cells 7' in a storage cell and its gate is fed with the precharge signal prech, which could be regarded as a clock signal. A second transistor T4, in this embodiment shown as being of n-type, has its source connected to a voltage OV, its drain to the access wire acc in all the bit cells 7' in a storage cell and its gate is controlled by an external control, which sets a voltage V3 which will be high when the voltage OV shall be set on the access wire acc. As mentioned above the wire acc will be connected to all the bit cells in a storage cell, which for instance includes 38 bit cells, and all the bit cells will thus have the same control regarding the wire acc. For controlling the wire acc a precharge is made in a first phase, controlling the MOS FET T3 to its conducting state and thus setting the wire acc on the voltage Vr. In the next phase the signal V3, being either high or low depending upon the kind of control to be made, low or high voltage for the wire acc, is fed to the MOS FET T4. The voltage level of the wire acc is amplified in an amplifier AMP and transferred to the external circuits for further operation. The provision of the control signals to the head 8, as well as to the drive circuit 9 described below, and the use of the input and output signals of these circuits are not a part of this invention and will therefore not be further described An embodiment of a drive and sense circuit 9 for the bit cell wires d and d* is illustrated schematically in another dashed square in FIG. 2. However, it is to be noted that the circuit 9 only illustrates one possible way to drive and sense the wires d and d*.

The write circuit for the wire d includes a first pair of transistors T5 and T6, the first shown to be of n-type and the second of p-type in the embodiment, having their drains connected to the wire d, and providing a voltage divider. The transistor T5 has its source connected to a potential Vr, and its gate is fed with the precharge signal prech. The other transistor T6 has its drain connected to a potential Vcc, and its gate is fed with a control signal V4 going low when the potential Vcc shall be fed to the wire d as will be explained further below. The write circuit for the wire d also includes a series connection of the source/drain paths of a p-type transistor T9 and a n-type transistor T10 connected between the voltage source Vcc and the drain of a n-type transistor T11 having its source connected to earth and its gate connected to an input write from the external control. The interconnection between the drains of the transistors T9 and T10 is connected to the gate of the transistor T6 and bears the voltage V4. The gate of the transistor T9 is fed with the inverted precharge signal prech connecting the gate of the transistor T6 to the source voltage Vcc through a conducting transistor T9 during the precharge phase.

The write circuit for the wire d* includes a second pair of series coupled transistors T7 and T8, the first shown to be of n-type and the second of p-type in the embodiment, having their drains connected to the wire d*, and also providing a voltage divider The transistor T7 has its source connected to a potential Vr, and its gate is fed with the precharge signal prech. The other transistor T8 has its drain connected to a potential Vcc, and its gate is fed with a control signal V5 going low when the potential Vcc shall be fed to the wire d*.

The write circuit for the wire d* also includes a series connection of the source/drain paths of a p-type transistor T12 and a n-type transistor T13 connected between the voltage source Vcc and the drain of the transistor T11. The interconnection between the drains of the transistors T12 and T13 is connected to the gate of the transistor T8 and bears the voltage V5. The gate of the transistor T12 is fed with the inverted precharge signal prech* connecting the gate of the transistor T8 to the source voltage Vcc through a conducting transistor T12 during the precharge phase.

The external wire IN/OUT for input and output is connected to two tristate inverters. One of the tristate inverters having its output connected to the wire IN/OUT includes a series connection of the source/drain paths of two n-type transistors T14, T15 and two p-type transistors T16, T17. The gate of the transistor T16 is connected to an external control wire providing the signal bitin and the gate of the transistor T15 is fed with the inverted signal bitin* . The second of the tristate inverters having its input connected to the wire IN/OUT includes a series connection of the source/drain paths of two n-type transistors T18, T19 and two p-type transistors T20, T21. The gate of the transistor T19 is connected to the external control wire providing the signal bitin and the gate of the transistor T20 is fed with the inverted signal bitin* . The output of the second tristate inverter is connected to the gate of the transistor T13 and through an inverter INV to the gate of the transistor T10.

A read amplifier including a n-type transistor T22 having its source connected to earth, its gate connected to a constant voltage Vbias which holds the transistor T22 constantly conducting and functioning as a current generator, and its drain connected to a parallel connection of two series connected source/drain paths of a n-type transistor and a p-type transistor, T23, T24 and T25, T26, respectively, having their other end connected to the source voltage Vcc. The gates of the p type transistors T24 and T26 are interconnected and connected to the interconnection of the drains of the transistors T23 and T24. The gate of the transistor T23 is connected to the wire d of the bit cell 7', and the gate of the transistor T25 is connected to the wire d*.

Each clock period, the signals prech and prech*, is divided into a precharge phase, in which the signal prech is high, and a make phase, in which the signal prech is low and the other control signals from the external control determines the operation to be made. Thus, at the precharge phase the wires d, d* and acc are precharged to the voltage Vr, through the transistors T5, T7 and T3, respectively.

The signals bitin and bitin* controls when data will be sent to and from the bit cell 7'. When the signal bitin is low and the signal bitin* high, then data will be transferred from the bit cell to the wire IN/OUT by the first tristate inverter When the signal bitin is high and the signal bitin* low, then data will be transferred to the bit cell from the wire IN/OUT by the second tristate inverter.

At the read operation in phase two, after the precharge of the wires d, d* and acc to Vr, the wires d and d* are left floating, and the wire acc is put on the voltage OV by a high voltage V3 making the transistor T4 conducting. This causes the node having the lowest potential, say n1, to be lowered to a potential between Vr and OV. Because of this a current is flowing from the wire d to the node n1 to the wire acc. This current discharges the wire d, i.e. the voltage on the wire d is lowered. This voltage reduction is measured by the read amplifier T22 to T26. The result of the reading is provided on the interconnection between the drains of the transistors T25 and T26 and fed to the input of the first tristate inverter T14 to T17. The signal bitin being low and the signal bitin* being high provides a transfer of the read and amplified bit value to the input/output wire IN/OUT. It is important that the wires d and d* are not driven in an active way during the phase two, since then no voltage reduction should be obtained on one of the wires Thus, for the read operation both d an d* are initially provided on the potential Vr. Both d and d* are substantially kept on the potential Vr, but one of them falls somewhat because of "current in" into the cell which discharges one of the wires d, d*. Since Vr here is defined as "low", the low potential will be lower than "low". d and d* give the read values. d lower than d* gives FALSE, d higher than d* TRUE. For write false, write true, don't write and don't comp. operations the information potentials on the wires d and d* don't give any information.

For a write operation in phase two, after the precharge of the wires d, d* and acc to Vr, the wire acc is put on the voltage OV by a high voltage V3 making the transistor T4 conducting. The value to be stored is provided on the input/output wire IN/OUT. The signals bitin high and bitin* low activate the second tristate inverter T18 to T21 to transfer the value on the wire IN/OUT to its output. The control signal write being high on the gate of the transistor T11 connects the sources of the transistors T10 and T13 to OV.

A high signal from the second tristate inverter T18 to T21, i.e. a "0" or false to be written, controls the transistor T13 to conducting state, setting the voltage V5 to low voltage, the transistor T8 is controlled to be conducting and the wire d* is put on the voltage Vcc, i.e. high. The inverted signal from the second tristate inverter fed to the gate of the transistor T10, being low, will keep it non-conducting, the voltage V4 being connected to the voltage source Vcc during the precharge phase will be kept on this voltage. The transistor T6 will be kept non-conducting, and the voltage Vr connected to the wire d during the precharge interval through the transistor T5 will be kept.

A low signal from the second tristate inverter T18 to T21, i e a "1" or true to be written, will control the write circuit T5, T6, T9, T10 for the wire d to set it on the high voltage Vcc through the inverter INV while the write circuit T7, T8, T12, T13 will keep the wire d* on the voltage Vr it was set on during the precharge phase.

As apparent from the examples above, the storage nodes n1 and n2 are in the embodiment shown in FIG. 2 used in the following way of operation. One of the nodes n1, n2 or both are charged or discharged during the second phase of the operation cycle dependent upon which ones of the control signals V3, V4 and V5 to be used, i.e. if the wire acc is set on OV or if one of (or both) the wires d and d* is set on Vcc.

As mentioned above, every operation cycle is composed of a precharging period and an execution period. Thus, when it is mentioned below that the wire acc is set high it is meant that the signal V3 is not controlling the transistor T4 to set the voltage OV on the wire acc during the execution period. Likewise, when it is mentioned below that the wire d or d* is set low it is meant that the control signal V4 or V5 is not controlling the transistor T6 or T8 to be in a state coupling through the voltage Vcc, being higher than the voltage Vr, to the wire d or d* during the execution period. However, when the wire d or d* is set high then the transistor T6 or T8 will be controlled to connect through the voltage Vcc to the wire.

The storage cell area could be rather extensive, for instance including 256 storage cells, which means that each pair of transistors T5, T6 and T7, T8, respectively, is connected to a wire serving one bit cell in all the storage cells, such as 256 bit cells. Therefore, the transistor sizes must be adjusted to the total bus capacitances and the desired speed.

The voltage Vr could be created from a shorted inverter in order to keep a known relation between Vr and the drive amplifier inverter. The access circuits in the head shall control the bit cells and also capture the information from the bit cells.

The following functional states are settable by the control states:

rest 10 in which the cell is just storing the value vstore, read false 10 in which the value vstore=false can be read, read true 10 in which the value vstore=true can be read, don't read 10 in which the cell is just storing the value vstore, write false   in which the stored value vstore is set to 'false', write true 10 in which the stored value vstore is set to 'true', don't write 10 in which the cell is just storing the value vstore, comp. false 10 in which the stored value vstore is compared to a value 'false', comp. true in which the stored value vstore is compared to a value 'true', don't comp. 10 in which the cell is just storing the value vstore.

The following is an operation table for different operation modes of a bit cell:

| Op. mode | acc | d | d* |
| --- | --- | --- | --- |
| rest | high | low | low |
| read false | low | current in | low |
| read true | low | low | current in |
| don't read | high | arbitrary | arbitrary |
| write false | low | low | high |
| write true | low | high | low |
| don't write | high | arbitrary | arbitrary |
| comp. false | arbitrary | low | high |
| comp. true | arbitrary | high | low |
| don't comp. | arbitrary | low | low |

For comp. false and comp. true the wire acc should have the state current out if a comparison result is DIFFERENT For the comp. false or comp. true operations the wire acc (access wire) gives the result of the comparison The wire acc is precharged to Vr and the input data is supplied on the wire d, and its inverse value on the wire d. If the value stored in the bit cell is different than the input data, the wire acc will be charged through one of the diodes D1 or D2, and through the corresponding n-type transistor, T1 or T2. This is detected by an amplifier AMP T11 in the head 8 When a compared FIT is detected the wire acc will be kept on the potential Vr.

The expressions current in and current out expresses that a charge is moved into and out of, respectively, the wire in question during a time sequence. This is usually made by initiating the wire to HIGH or LOW, respectively, in the operation mode REST and then change into the actual mode. A current will then discharge or charge, respectively, the wire in question. When there is no current no appreciable charge will be transported Therefore, no voltage change will be provided during the time sequence.

While the invention has been described with reference to specific embodiments, it will be understood by those skilled in the art that various changes may be made and equivalents may be substituted for elements thereof without departing from the true spirit and scope of the invention. In addition, modifications may be made without departing from the essential teachings of the invention.

We claim:

1. A memory bit cell for implementation in VLSI techniques comprising:
   a cell circuit (T1, T2, L1, L2, D1, D2; T1, T2, I1; I2, D1, D2) in which a bit value is storable, said value being either 'true' or 'false';
   a first connection (Vcc) which is constantly provided with a supply voltage;
   a second, a third and a fourth connection (acc, d, d*) each of which is settable in different control states;
   a drive and sense circuit (9) connected to said third and fourth connections (d, d*);
   a head circuit (8) connected to said second connection (acc);
   wherein said second, third and fourth connections (acc, d, d*) can take different set states, and said memory bit cell can take an individual among a set of functional states and
   wherein said drive and sense circuit (9) and said head circuit (8) are adapted to read a bit value from said cell circuit (T1, T2, L1, L2, D1, D2; T1, T2, I1, I2, D1, D2), to write a bit value to said cell circuit (T1, T2, L1, L2, D1, D2; T1, T2, I1, I2, D1, D2) and to compare a bit value stored on said cell circuit (T1, T2, L1, L2, D1, D2; T1, T2, I1, I2, D1, D2) within input data supplied on said third and fourth connection (d, d*), said head circuit (8) comprising a means to detect a voltage change on said second connection (acc), said voltage change being indicative of a result of the comparison.

2. A memory bit cell according to claim 1, wherein said control states for controlling said cell circuit are "high" level, "low" level, no current into cell, current into cell for all said second, third and fourth connections and also current out of cell for at least one (acc) of said connections, "high" and "low" level being related to if the voltages are regarded as positive or negative going, i.e. related to if the voltage Vcc on said first connection is positive or negative in relation to earth.

3. A memory bit cell according to claim 2, wherein said second connection is an access connection (acc) and said third and fourth connections (d, d*) having signals having inverted levels relative to each other when writing or reading said cell circuit.

4. A memory bit cell according to claim 1, wherein the cell is adapted to be controlled by a control cycle including the phases, a first precharge phase in which said second, third, and fourth connection is connected to an extra voltage (Vr) lying between said first connection voltage (Vcc) and earth, and a second operation phase for getting it in a prescribed functional state, a "high" and "low" level being taken in relation to said extra voltage (Vr), said "high" and "low" level being related to if the voltages in the circuit are regarded as positive or negative going.

5. A memory bit cell according to claim 1, in which said cell circuit is settable in the following functional states by different combinations of said control states on said second, third and fourth connections:
   rest 10 in which said cell circuit is just storing said bitvalue,
   read 10 in which said bit value can be read from said cell circuit,
   don't read 10 in which said cell circuit is just storing said bit value,
   write false 10 in which said bit value stored in said cell circuit is set to 'false',
   write true 10 in which said bit value stored in said cell circuit is set to 'true',
   don't write 10 in which said cell circuit is just storing said bit value,
   comp. false 10 in which said bit value stored in said cell circuit is compared to a value 'false',
   comp. true 10 in which said bit value stored in said cell circuit is compared to a value 'true',
   don't comp. 10 in which said cell circuit is just storing said bit value.

6. A memory bit cell according to claim 1, wherein said cell circuit includes a flip-flop (T1, T2, L1, L2, D1, D2; T1, T2, I1, I2, D1, D2) controllable from each side via said third and fourth connections (d, d*), wherein said flip-flop has a first and a second node (n1, n2) settable on different voltage levels, and wherein said flip-flop has its supply voltage between said first (Vcc) and second connections (acc), said second connection being controllable to different voltage levels.

7. A memory bit cell according to claim 6, wherein, between said second connection (acc) and said first connection ($V_{cc}$), a first and a second series connection are provided in parallel, each including the source/drain path of a transistor and a load (T1,L1 and T2,L2), the interconnection between said load and said transistor in said first series connection being said first node (n1) and being connected to the gate of said transistor in said second series connection, and being connected to the gate of the transistor in said first series connection, wherein a first rectifying element (D1) is connected between said third connection (d) and said first node permitting current to flow only in one direction relative to said third connection and a second rectifying element (D2) is connected between said fourth connection (d ) and said second node (n2) permitting current to flow only in one direction relative to said fourth connection.

8. A memory bit cell according to claim 7, wherein said rectifying elements (D1 and D2) are chosen among the following components:
   (1) n-channel MOS FET in which the drain and the gate are interconnected (positive voltages)
   (2) p-channel MOS FET in which the drain and the gate are interconnected (negative voltages)
   (3) pn-diode (positive voltages, negative voltages with the diode reversed)
   (4) Schottey-diode (positive voltages, negative voltages with the diode reversed.

9. A memory bit cell according to claim 7, wherein said transistors (T1 and T2) are chosen among the following components:
   (1) n-channel MOS FET (positive voltages)

(2) p-channel MOS FET (negative voltages)
(3) npn bipolar transistor (positive voltages)
(4) pnp bipolar transistor (negative voltages).

10. A memory bit cell according to claim 7, wherein said loads (L1 and L2) are chosen among the following components:
  (1) a resistor
  (2) n-channel enhancement type MOS FET having its drain and gate interconnected (positive voltages)
  )3) p-channel enhancement type MOS FET having its drain and gate interconnected (negative voltages)
  (4) p-channel depletion type MOS FET having its drain and gate interconnected (positive voltages)
  (5) p-channel depletion type MOS FET having its drain and gate interconnected (negative voltages)
  (6) n-channel MOS FET having its gate as a control electrode and the source and the drain as drive connections (positive voltages)
  (7) p-channel MOS FET having its gate as a control electrode and the source and the drain as drive connections (negative voltages)
  (8) npn bipolar transistor having the base as the control electrode and the emitter and collector as drive connections (positive voltages)
  (9) pnp bipolar transistor having the base as the control electrode and the emitter and collector as drive connections (negative voltages).

11. A memory bit cell according to claim 5 in which "low" and "high" voltage being related to if the voltages in said bit cell are regarded as positive or negative going, i.e. related to if the voltage Vcc on said first connection is positive or negative in relation to earth, wherein said operation mode rest is set by the following combination on the connections acc, d, d*: high, low, low.

12. A memory bit cell according to claim 5 in which "low" and "high" voltage being related to if the voltages in said bit cell are regarded as positive or negative going, i.e. related to if the voltage Vcc on said first connection is positive or negative in relation to earth, wherein said operation mode read false is set by the following combination on the connections acc, d, d*: low, current in, low.

13. A memory bit cell according to claim 5 in which "low" and "high" voltage being related to if the voltages in said bit cell are regarded as positive or negative going, i.e. related to if the voltage Vcc on said first connection is positive or negative in relation to earth, wherein said operation mode read true is set by the following combination on the connections acc, d, d*: low, low, current in.

14. A memory bit cell according to claim 5 in which "low" and "high" voltage being related to if the voltages in said bit cell are regarded as positive or negative going, i.e. related to if the voltage Vcc on said first connection is positive or negative in relation to earth, wherein said operation mode don't read is set by the following combination on the connections acc, d, d*: high, arbitrary, arbitrary.

15. A memory bit cell according to claim 5 in which "low" and "high" voltage being related to if the voltages in said bit cell are regarded as positive or negative going, i.e. related to if the voltage Vcc on said first connection is positive or negative in relation to earth, wherein said operation mode write false is set by the following combination on the connections acc, d, d*: low, low, high.

16. A memory bit cell according to claim 5 in which "low" and "high" voltage being related to if the voltages in said bit cell are regarded as positive or negative going, i.e. related to if the voltage Vcc on said first connection is positive or negative in relation to earth, wherein said operation mode write true is set by the following combination on the connections acc, d, d*: low, high, low.

17. A memory bit cell according to claim 5 in which "low" and "high" voltage being related to if the voltages in said bit cell are regarded as positive or negative going, i.e. related to if the voltage Vcc on said first connection is positive or negative in relation to earth, wherein said operation mode don't write is set by the following combination on the connections acc, d, d*: high, arbitrary, arbitrary.

18. A memory bit cell according to claim 5 in which "low" and "high" voltage being related to if the voltages in said bit cell are regarded as positive or negative going, i.e. related to if the voltage Vcc on said first connection is positive or negative in relation to earth, wherein said operation mode comp. false is set by the following combination on the connections acc, d, d*: arbitrary, low, high.

19. A memory bit cell according to claim 5 in which "low" and "high" voltage being related to if the voltages in said bit cell are regarded as positive or negative going, i.e. related to if the voltage Vcc on said first connection is positive or negative in relation to earth, wherein said operation mode comp. true is set by the following combination on the connections acc, d, d*: arbitrary, high, low.

20. A memory bit cell according to claim 5 in which "low" and "high" voltage being related to if the voltages in said bit cell are regarded as positive or negative going, i.e. related to if the voltage Vcc on said first connection is positive or negative in relation to earth, wherein said operation mode don't comp. is set by the following combination on the connections acc, d, d*: arbitrary, low, low.

* * * * *

UNITED STATES PATENT AND TRADEMARK OFFICE
CERTIFICATE OF CORRECTION

PATENT NO. :   5,239,502
DATED      :   August 24, 1993
INVENTOR(S):   Lars Gunnar CARLSTEDT It is certified that error appears in the above—identified patent and that said Letters Patent is hereby corrected as shown below:

On the title page, in Item [75], change the name of the inventor from "Lars G. Carlstedt" to --Lars Gunnar Carlstedt--.

Column 8, line 22, cancel "10";
         line 24, cancel "10";
         line 26, cancel "10";
         line 28, cancel "10";
         line 32, cancel "10";
         line 34, cancel "10";
         line 36, cancel "10";
         line 40, cancel "10".

UNITED STATES PATENT AND TRADEMARK OFFICE
CERTIFICATE OF CORRECTION

PATENT NO. : 5,239,502
DATED : August 24, 1993
INVENTOR(S) : Lars Gunnar Carlstedt It is certified that error appears in the above-indentified patent and that said Letters Patent is hereby corrected as shown below:

Column 10 (claim 5), line 10, cancel "10";
line 12, cancel "10";
line 14, cancel "10";
line 16, cancel "10";
line 18, cancel "10";
line 20, cancel "10";
line 22, cancel "10";
line 24, cancel "10";
line 26, cancel "10".

Signed and Sealed this

Twenty-eighth Day of May, 1996

Attest:

BRUCE LEHMAN

*Attesting Officer*     *Commissioner of Patents and Trademarks*